US 11,189,537 B2

(12) United States Patent
Hosseini et al.

(10) Patent No.: US 11,189,537 B2
(45) Date of Patent: Nov. 30, 2021

(54) CIRCUIT PACKAGE, AN ELECTRONIC CIRCUIT PACKAGE, AND METHODS FOR ENCAPSULATING AN ELECTRONIC CIRCUIT

(75) Inventors: Khalil Hosseini, Weihmichl (DE); Joachim Mahler, Regensburg (DE); Edward Fuergut, Dasing (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 15 days.

(21) Appl. No.: 13/425,589

(22) Filed: Mar. 21, 2012

(65) Prior Publication Data
US 2013/0249069 A1 Sep. 26, 2013

(51) Int. Cl.
*H01L 23/051* (2006.01)
*H01L 21/56* (2006.01)
(Continued)

(52) U.S. Cl.
CPC .......... *H01L 23/051* (2013.01); *H01L 21/561* (2013.01); *H01L 21/568* (2013.01);
(Continued)

(58) Field of Classification Search
CPC .......... H01L 2224/48227; H01L 2224/73265; H01L 2924/15331; H01L 2224/16227;
(Continued)

(56) References Cited

U.S. PATENT DOCUMENTS

| | | | |
|---|---|---|---|
| 5,484,959 A * | 1/1996 | Burns | ................. H01L 23/4951 174/536 |
| 6,297,559 B1 * | 10/2001 | Call | .................... H01L 21/4853 228/180.22 |

(Continued)

FOREIGN PATENT DOCUMENTS

| | | |
|---|---|---|
| CN | 201681932 U | 12/2010 |
| DE | 102007039916 A1 | 2/2009 |
| DE | 102008035911 A1 | 4/2009 |
| DE | 102008057707 A1 | 6/2009 |
| DE | 102009012524 A1 | 10/2009 |

(Continued)

OTHER PUBLICATIONS

Office Action issued for German patent application 102013102893.4 dated May 13, 2014.
(Continued)

*Primary Examiner* — Mark W Tornow
*Assistant Examiner* — Priya M Rampersaud
(74) *Attorney, Agent, or Firm* — Viering, Jentschura & Partner mbB

(57) ABSTRACT

A circuit package is provided, the circuit package including: an electronic circuit; a metal block next to the electronic circuit; encapsulation material between the electronic circuit and the metal block; a first metal layer structure electrically contacted to at least one first contact on a first side of the electronic circuit; a second metal layer structure electrically contacted to at least one second contact on a second side of the electronic circuit, wherein the second side is opposite to the first side; wherein the metal block is electrically contacted to the first metal layer structure and to the second metal layer structure by means of an electrically conductive medium; and wherein the electrically conductive medium includes a material different from the material of the first and second metal layer structures or has a material structure different from the material of the first and second metal layer structures.

20 Claims, 13 Drawing Sheets

(51) Int. Cl.
*H01L 23/495* (2006.01)
*H01L 23/00* (2006.01)
*H01L 23/31* (2006.01)

(52) U.S. Cl.
CPC .......... *H01L 23/49524* (2013.01); *H01L 23/49562* (2013.01); *H01L 24/83* (2013.01); *H01L 24/96* (2013.01); *H01L 23/3107* (2013.01); *H01L 24/27* (2013.01); *H01L 24/29* (2013.01); *H01L 24/32* (2013.01); *H01L 24/33* (2013.01); *H01L 24/75* (2013.01); *H01L 2224/2732* (2013.01); *H01L 2224/2745* (2013.01); *H01L 2224/27318* (2013.01); *H01L 2224/291* (2013.01); *H01L 2224/293* (2013.01); *H01L 2224/2929* (2013.01); *H01L 2224/29294* (2013.01); *H01L 2224/32245* (2013.01); *H01L 2224/331* (2013.01); *H01L 2224/33181* (2013.01); *H01L 2224/753* (2013.01); *H01L 2224/8346* (2013.01); *H01L 2224/8384* (2013.01); *H01L 2224/83191* (2013.01); *H01L 2224/83192* (2013.01); *H01L 2224/83203* (2013.01); *H01L 2224/83424* (2013.01); *H01L 2224/83439* (2013.01); *H01L 2224/83444* (2013.01); *H01L 2224/83447* (2013.01); *H01L 2224/83455* (2013.01); *H01L 2224/83464* (2013.01); *H01L 2224/83801* (2013.01); *H01L 2224/83851* (2013.01); *H01L 2224/96* (2013.01); *H01L 2924/01327* (2013.01); *H01L 2924/12032* (2013.01); *H01L 2924/12042* (2013.01); *H01L 2924/1301* (2013.01); *H01L 2924/1305* (2013.01); *H01L 2924/1306* (2013.01); *H01L 2924/13034* (2013.01); *H01L 2924/13091* (2013.01); *Y10T 29/49146* (2015.01)

(58) Field of Classification Search
CPC .......... H01L 2224/32245; H01L 2224/73215; H01L 2224/73253; H01L 24/16; H01L 24/32; H01L 24/48; H01L 24/73; H01L 24/81; H01L 24/83; H01L 24/85; H01L 2924/00014; H01L 2924/00; H01L 2224/27318; H01L 2224/2732; H01L 2224/2745; H01L 2224/291; H01L 2224/2929; H01L 2224/29294; H01L 2224/293; H01L 2224/83192; H01L 2224/83424; H01L 2224/83439; H01L 2224/83444; H01L 2224/83447; H01L 2224/83455; H01L 2224/8346; H01L 2224/83464; H01L 2224/83801; H01L 2224/83851; H01L 2224/96; H01L 2924/01327; H01L 2924/12032; H01L 2924/12042; H01L 2924/1301; H01L 2924/13034; H01L 2924/1305; H01L 2924/1306; H01L 2924/13091; H01L 2224/83; H01L 2924/014; H01L 21/561; H01L 21/568; H01L 2224/331; H01L 2224/33181; H01L 2224/753; H01L 2224/83191; H01L 2224/83203; H01L 2224/8384; H01L 23/051; H01L 23/3107; H01L 23/49524; H01L 23/49562; H01L 24/27; H01L 24/29; H01L 24/33; H01L 24/75; H01L 24/96; H01L 2224/04105; H01L 2224/0603; H01L 2224/06181

See application file for complete search history.

(56) References Cited

U.S. PATENT DOCUMENTS

| | | | |
|---|---|---|---|
| 6,607,942 B1* | 8/2003 | Tsao et al. | 438/122 |
| 7,759,163 B2 | 7/2010 | Kroeninger et al. | |
| 8,129,225 B2 | 3/2012 | Landau et al. | |
| 2002/0117762 A1 | 8/2002 | Ikegami | |
| 2008/0030929 A1* | 2/2008 | Chacko | H01G 9/012 361/523 |
| 2008/0222885 A1* | 9/2008 | Kanda | H05K 1/142 29/842 |
| 2008/0230877 A1* | 9/2008 | Chung | H01L 23/525 257/666 |
| 2009/0042337 A1 | 2/2009 | Landau et al. | |
| 2009/0137086 A1 | 5/2009 | Otremba et al. | |
| 2009/0230535 A1 | 9/2009 | Otremba et al. | |
| 2009/0261468 A1 | 10/2009 | Kroeninger et al. | |
| 2009/0322364 A1* | 12/2009 | Mangrum | G01R 31/2889 324/757.02 |
| 2010/0230797 A1* | 9/2010 | Honda | 257/687 |
| 2010/0285637 A1* | 11/2010 | Khan et al. | 438/122 |
| 2011/0156235 A1* | 6/2011 | Yuan | H01L 23/49833 257/690 |
| 2011/0169170 A1* | 7/2011 | Baba et al. | 257/774 |
| 2011/0220704 A1* | 9/2011 | Liu | B23K 35/262 228/252 |
| 2011/0268985 A1* | 11/2011 | Zhang | B23K 35/0244 428/615 |
| 2012/0018871 A1* | 1/2012 | Lee | H01L 23/4334 257/698 |
| 2012/0126404 A1* | 5/2012 | Wakiyama | H01L 23/3128 257/737 |
| 2013/0056863 A1* | 3/2013 | Chi | H01L 27/14683 257/704 |
| 2013/0207121 A1 | 8/2013 | Kawanami et al. | |

FOREIGN PATENT DOCUMENTS

| | | |
|---|---|---|
| DE | 102009015722 A1 | 10/2009 |
| WO | 2010147201 A1 | 12/2010 |

OTHER PUBLICATIONS

German Office Action issued for corresponding DE application 10 2013 022 508.6 dated Feb. 10, 2021, 7 pages (for informational purposes only).

\* cited by examiner

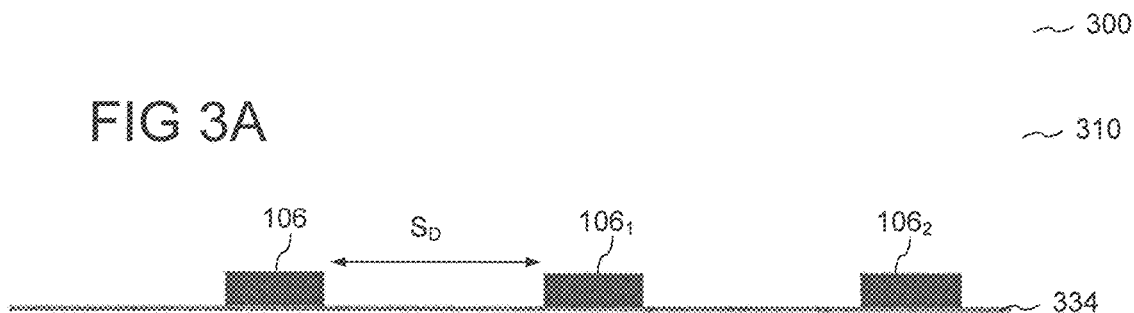
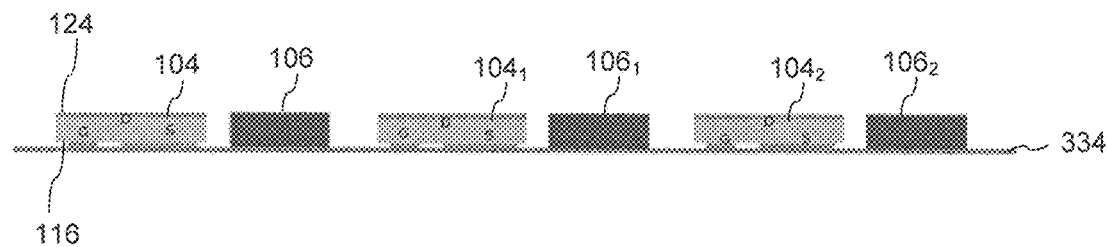
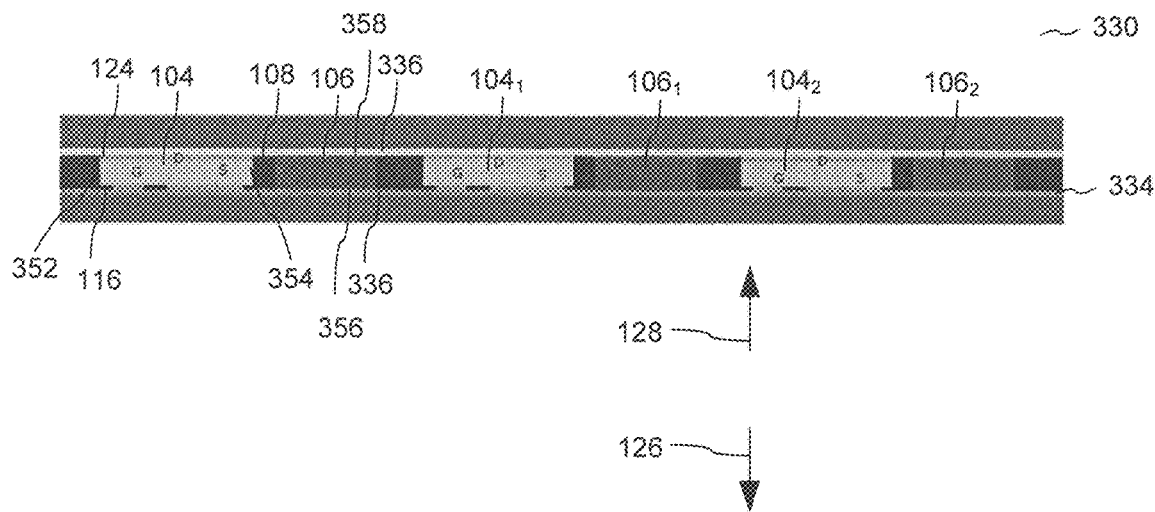

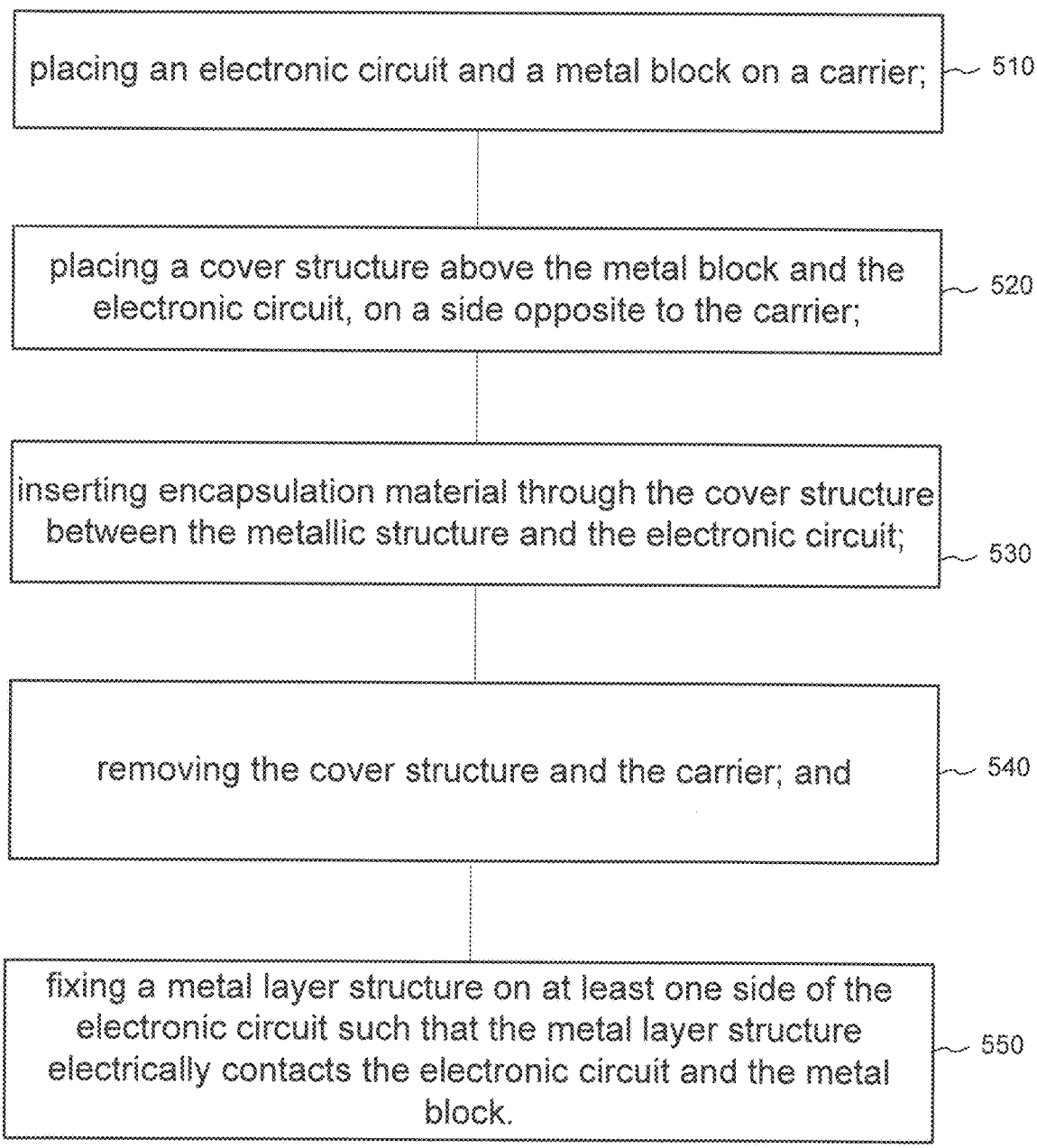

```
┌─────────────────────────────────────────────────────┐
│ forming encapsulation material for holding a metal  │
│ block next to a semiconductor chip between the      │─ 810
│ semiconductor chip and the metal block;             │
└─────────────────────────────────────────────────────┘
                          │
┌─────────────────────────────────────────────────────┐
│ electrically contacting a first metal layer         │
│ structure to at least one first contact on a first  │─ 820
│ side of the semiconductor chip;                     │
└─────────────────────────────────────────────────────┘
                          │
┌─────────────────────────────────────────────────────┐
│ electrically contacting a second metal layer        │
│ structure to at least one second contact on a       │
│ second side of the semiconductor chip, wherein      │─ 830
│ the second side is opposite to the first side; and  │
└─────────────────────────────────────────────────────┘
                          │
┌─────────────────────────────────────────────────────┐
│ electrically contacting the metal block to the      │
│ first metal layer structure and to the second       │
│ metal layer structure by means of an electrically   │
│ conductive contacting medium including a material   │─ 840
│ different from the material of the first and        │
│ second metal layer structures or a material         │
│ structure different from the material of the first  │
│ and second metal layer structures.                  │
└─────────────────────────────────────────────────────┘
```

CIRCUIT PACKAGE, AN ELECTRONIC CIRCUIT PACKAGE, AND METHODS FOR ENCAPSULATING AN ELECTRONIC CIRCUIT

TECHNICAL FIELD

Various embodiments relate generally to a circuit package, an electronic circuit package, and methods for encapsulating an electronic circuit.

BACKGROUND

Many semiconductor chip packages suffer from higher thermal and electrical resistance, low component reliability, long processing times and high processing costs. High thermal and electrical resistance may stem from a poor cooling design of the chip package. Long processing times and high processing costs may stem from the need for many serial single processes being carried out during chip package production.

SUMMARY

Various embodiments provide a circuit package, including: an electronic circuit; a metal block next to the electronic circuit; encapsulation material between the electronic circuit and the metal block; a first metal layer structure electrically contacted to at least one first contact on a first side of the electronic circuit; a second metal layer structure electrically contacted to at least one second contact on a second side of the electronic circuit, wherein the second side is opposite to the first side; wherein the metal block is electrically contacted to the first metal layer structure and to the second metal layer structure by means of an electrically conductive medium; and wherein the electrically conductive medium includes a material different from the material of the first and second metal layer structures or has a material structure different from the material of the first and second metal layer structures.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 3A to 3H show a method for encapsulating an electronic circuit according to an embodiment;

FIG. 5 shows a method for encapsulating an electronic circuit according to an embodiment;

FIG. 8 shows a method for encapsulating an electronic circuit according to an embodiment;

DETAILED DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over", used herein to describe forming a feature, e.g. a layer, "over" a side or surface, may be used to mean that the feature, e.g. the layer may be formed "directly on", e.g. in direct contact with, the implied side or surface. The word "over", used herein to describe forming a feature, e.g. a layer "over" a side or surface, may be used to mean that the feature, e.g. the layer may be formed "indirectly on" the implied side or surface with one or more additional layers being arranged between the implied side or surface and the formed layer.

Various embodiments provide embedding technology for holding a chip.

Various embodiments provide a chip package, e.g. a chip scale package CSP, which may be constructed using one or more parallel running processes.

Various embodiments provide a chip package, wherein a metal body may be exposed on one or more sides of the chip package, thereby providing optimal cooling of the package, and minimal thermal and electrical resistance.

Various embodiments provide an encapsulated chip scale package CSP component, including double-sided exposed chip contacts on a structured chip carrier, wherein the one or more exposed contacts may be realised in a single parallel process.

Figure 1:
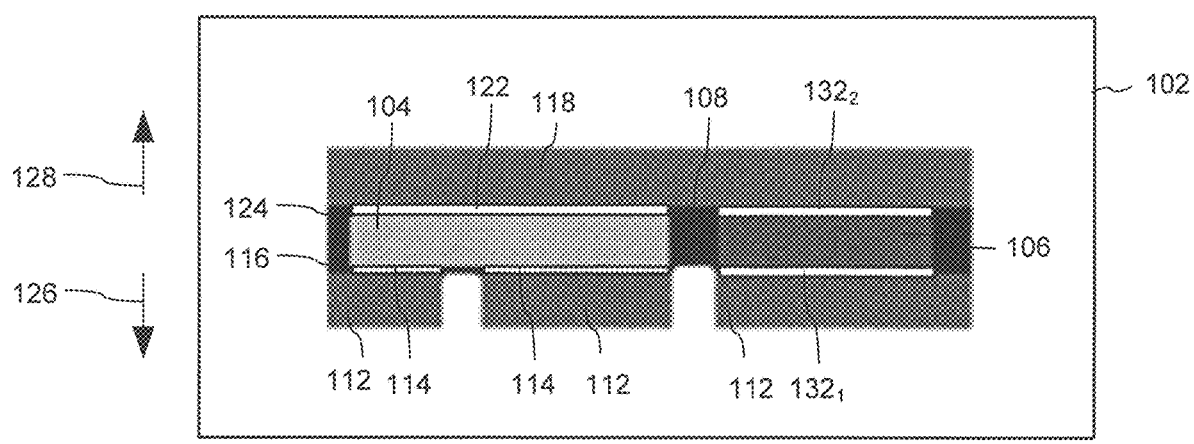
FIG. 1 shows a circuit package according to an embodiment.

FIG. 1 shows circuit package 102 according to an embodiment. Circuit package 102 may include electronic circuit 104 and metal block 106 next to electronic circuit 104. Electronic circuit 104 may be referred to hereinafter as a chip, a semiconductor chip, a semiconductor, a die. Circuit package 102 may include encapsulation material 108 between electronic circuit 104 and metal block 106. Circuit package 102 may include first metal layer structure 112 electrically contacted to at least one first contact 114 on first side 116 of electronic circuit 104. Circuit package 102 may include second metal layer structure 118 electrically contacted to at least one second contact 122 on second side 124 of electronic circuit 104. Second side 124 may be opposite to first side 116. In other words, first side 116 may face direction 126 which is opposite to direction 128 which second side 124 faces. Metal block 106 may be electrically contacted to first metal layer structure 112 and to second metal layer structure 118 by means of an electrically conductive medium $132_1$, $132_2$. Electrically conductive medium $132_1$, $132_2$ may include a material different from the material of first 112 and second 118 metal layer structures or may have a material structure different from the material of first 112 and second 118 metal layer structures.

Figure 2:
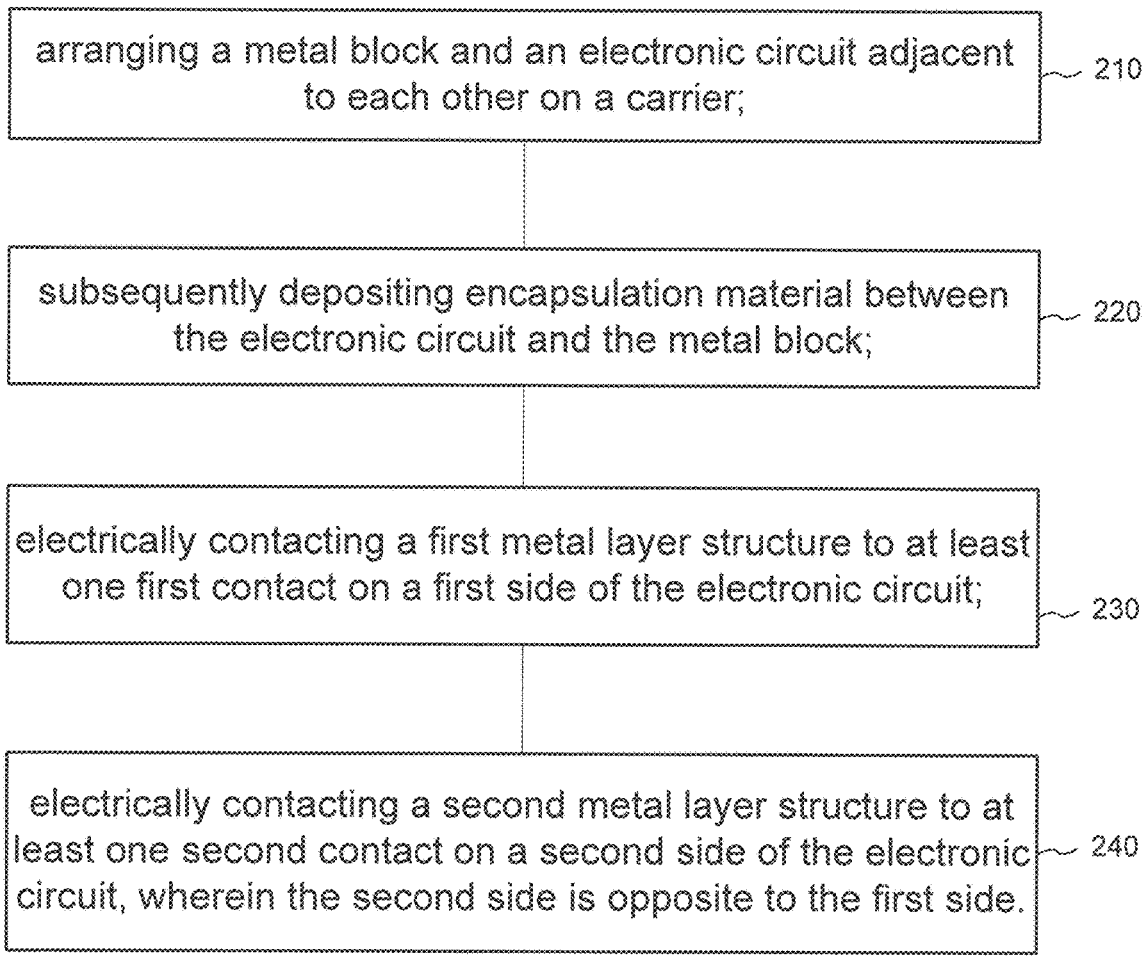
FIG. 2 shows a method for encapsulating an electronic circuit according to an embodiment.
Figure 3D:
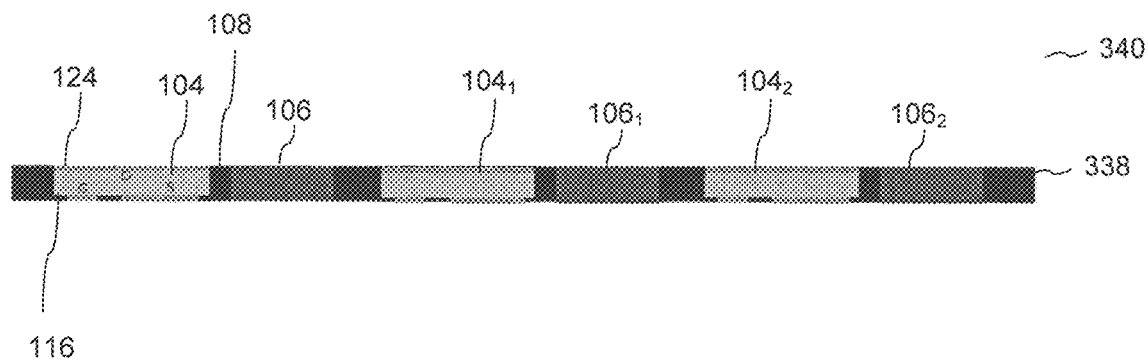
Figure 3E:
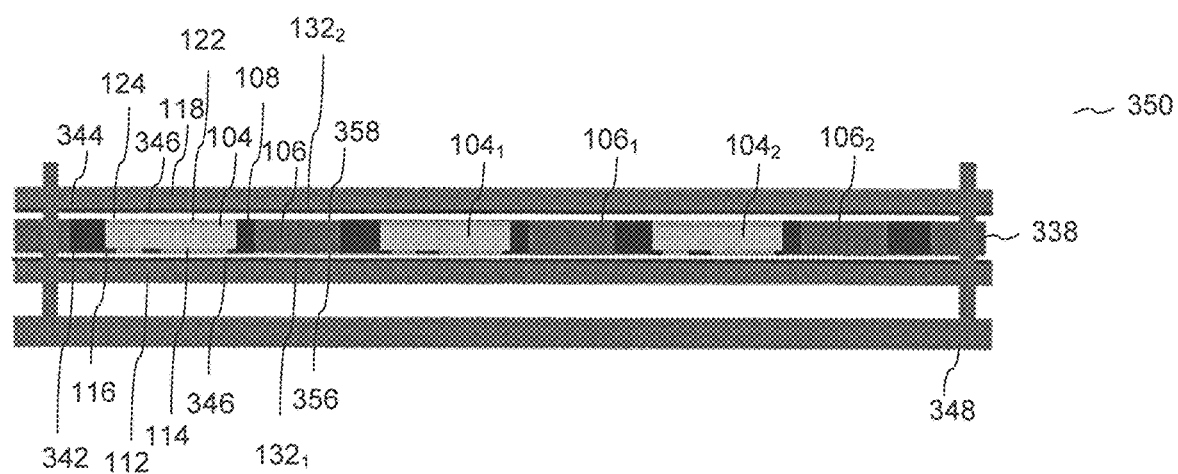
Figure 3F:
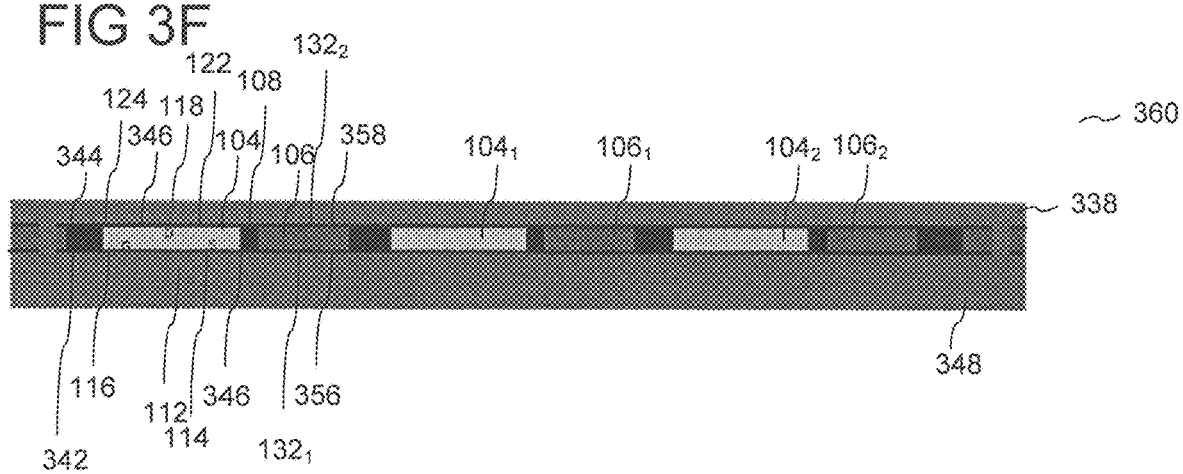
Figure 3G:
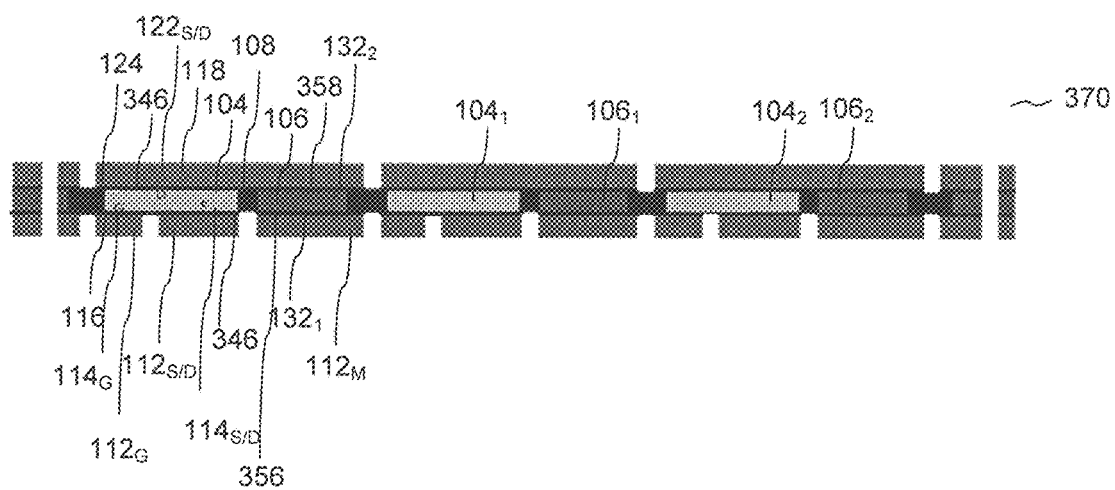
Figure 3H:
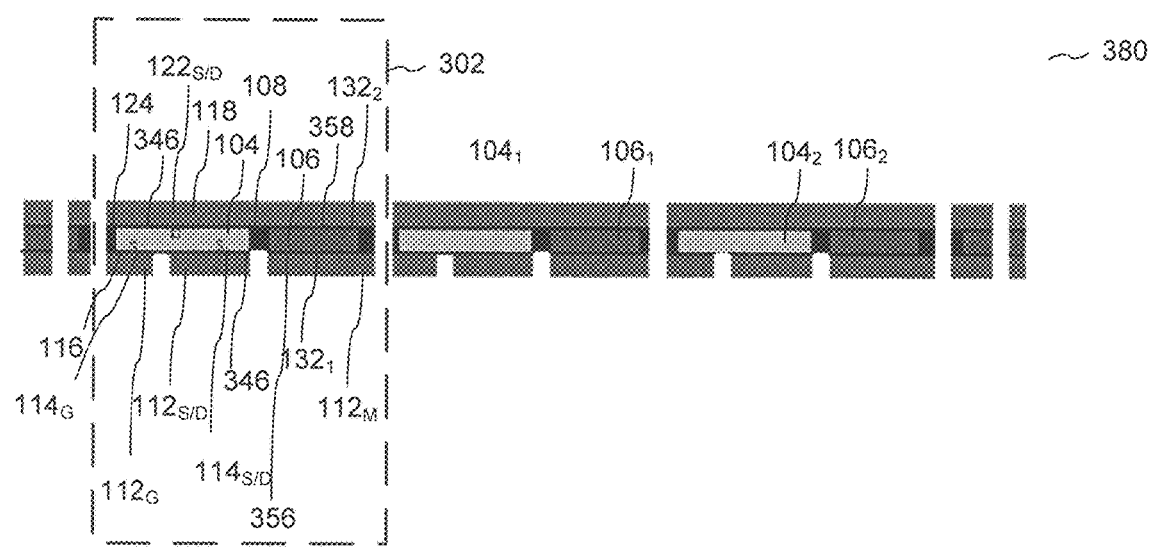
Figure 4A:
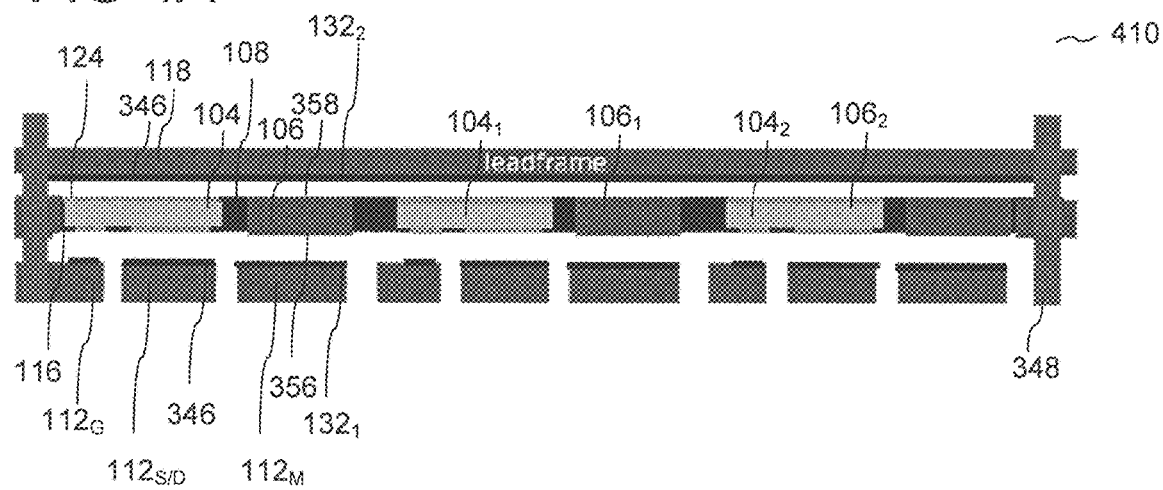
FIGS. 4A to 4D show a method for encapsulating an electronic circuit according to an embodiment.
Figure 4B:
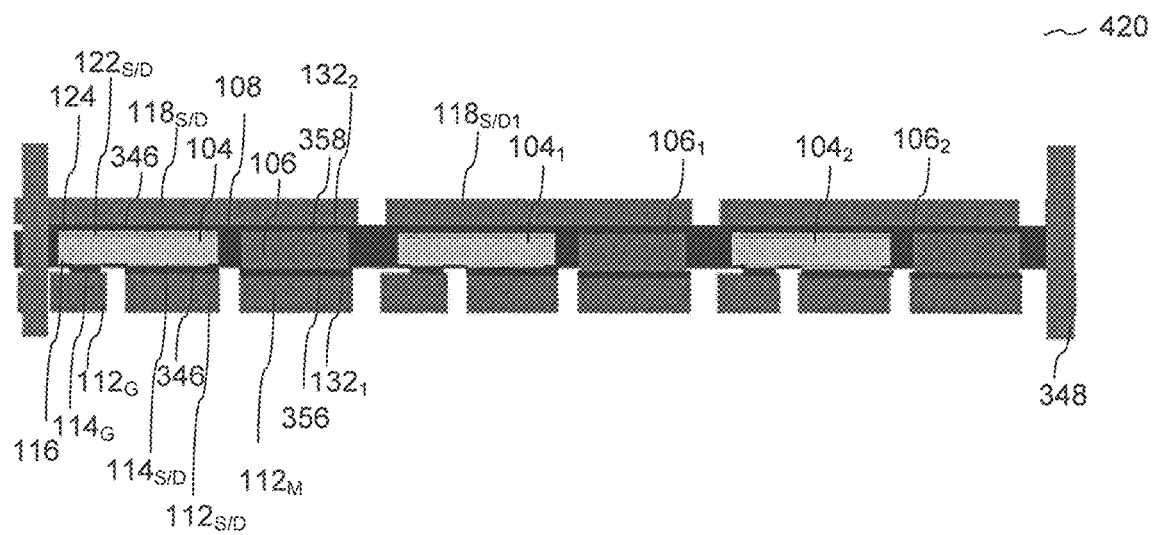
Figure 4C:
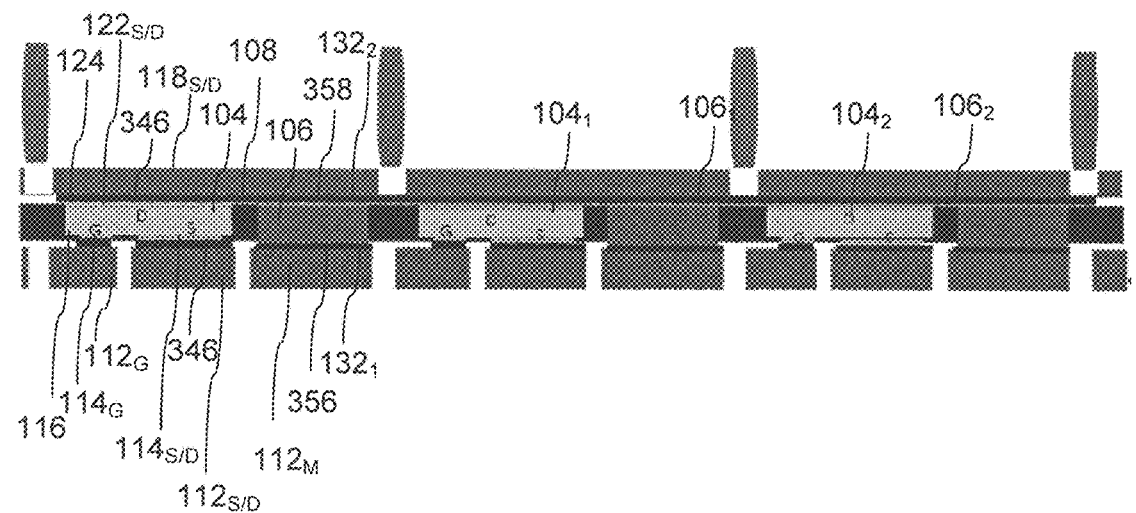
Figure 4D:
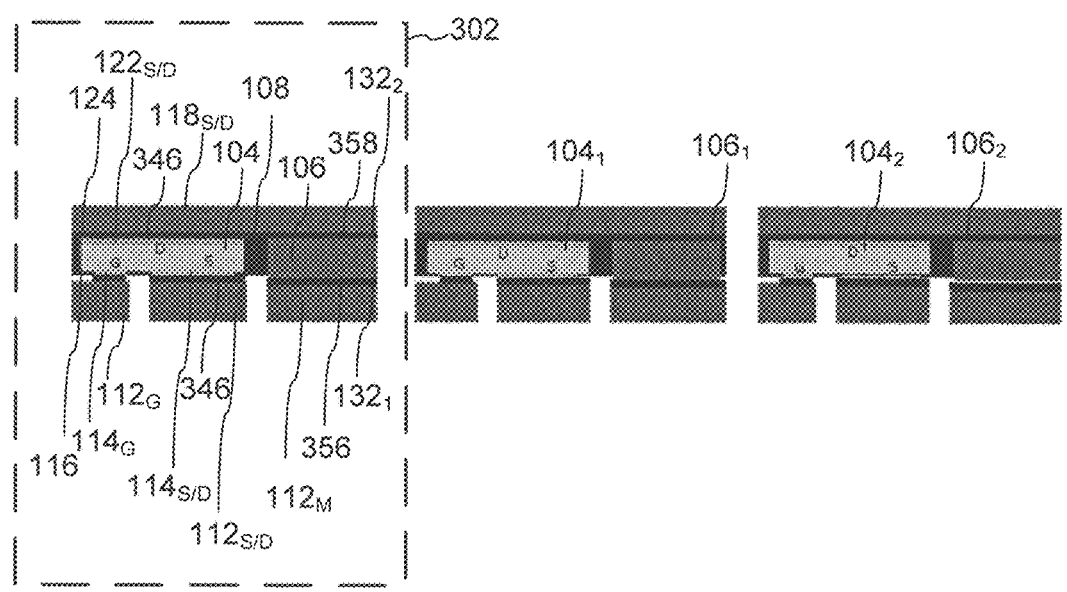

FIG. 2 shows method 200 for encapsulating an electronic circuit, e.g. electronic circuit 104, according to an embodiment. Method 200 may include:

arranging metal block and an electronic circuit adjacent to each other on a carrier (in 210);

subsequently depositing encapsulation material between the electronic circuit and the metal block (in 220);

electrically contacting a first metal layer structure to at least one first contact on a first side of the electronic circuit (in 230);

electrically contacting a second metal layer structure to at least one second contact on a second side of the electronic circuit, wherein the second side is opposite to the first side (240).

FIGS. 3A to 3H show method 300 for encapsulating one or more electronic circuits 104, $104_1$, $104_2$ ... $104_n$ according to an embodiment.

Figure 9:
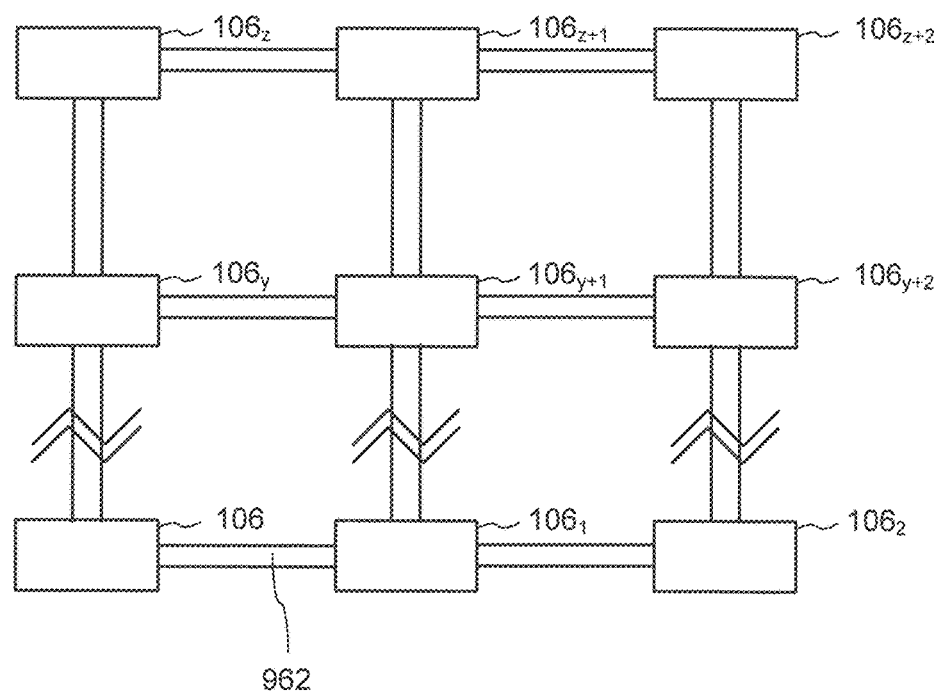
FIG. 9 shows a metal block array according to an embodiment.

In 310, one or more metal blocks 106, $106_1$, $106_2$ may be placed on carrier 334. One or more metal blocks 106, $106_1$, $106_2$ may be placed temporarily on carrier 334. One or more metal blocks 106, $106_1$, $106_2$ may include a lead frame, e.g. one or more parts of a lead frame, and carrier 334 may include a foil. The spacing, $S_D$ between one or more metal blocks may range from about 10 µm to about 1000 µm, e.g. about 20 µm to about 700 µm, e.g. about 50 µm to about 500 µm. One or more metal blocks 106, $106_1$, $106_2$ may each be placed individually on carrier 334, and adhered by means of adhesion tape. Alternatively, one or more metal blocks 106, $106_1$, $106_2$ may form part of a metal grid array. The metal grid array may include one or more metal blocks 106, $106_1$, $106_2$ ... $106_n$, arranged in an array; e.g. a one-dimensional array including a 1×n row of one or more metal blocks 106, $106_1$, $106_2$ ... $106_n$; or e.g. a two-dimensional array including an m×n matrix of one or more metal blocks. The one or more metal blocks 106, $106_1$, $106_2$ ... $106_n$ may be joined to each other by one or more interconnecting portions 962. FIG. 9 shows a top view of a metal block grid array according to various embodiments.

The metal grid array may include a complete grid of copper, or a lead frame. Metal block 106 may include at least one from the following group of materials, the group of materials consisting of: Cu, Au, Ag, Pd, Fe, Ni, Al and combinations thereof.

At least one of the first metal layer structure 112 and second metal layer structure 118 may include at least one from the following group of materials, the group of materials consisting of: Cu, Au, Ag, Pd, Ni, Fe, Al and combinations thereof.

Method 300 may include arranging one or more metal blocks 106, $106_1$, $106_2$ and one or more electronic circuits 104, $104_1$, $104_2$ adjacent to each other on carrier 334 such as shown in 320. Each of one or more electronic circuits 104, $104_1$, $104_2$ may be placed adjacent to at least one metal block 106, $106_1$, $106_2$ as shown in 310 and 320. For example, metal block 106 and electronic circuit 104 may be arranged adjacent to each other on carrier 334. It should be noted that the one or more electronic circuits 104, $104_1$, $104_2$ may be placed before placing metal block 106. Alternatively, the one or more electronic circuits 104, $104_1$, $104_2$ may be placed after having placed metal block 106. In yet another alternative, the one or more electronic circuits 104, $104_1$, $104_2$ and metal block 106 may be placed simultaneously.

Although three metal blocks 106, $106_1$, $106_2$, and three electronic circuits 104, $104_1$, $104_2$, are shown in the figures, it may be understood that the number of metal blocks and electronic circuits are not limited to three, but may each include one or more, e.g. one, two, three, four, five, six, seven, eight, nine, ten or even more, such as tens or hundreds.

Electronic circuit 104 may include a semiconductor chip, e.g. a die. The semiconductor chip may include electronic circuitry formed over a wafer substrate. The wafer substrate may include various materials, e.g. semiconductor materials. The wafer substrate may include at least one from the following group of materials, the group of materials consisting of: Silicon, Germanium, Group III to V materials, polymers. According to an embodiment, the wafer substrate may include doped or undoped silicon. According to another embodiment, the wafer substrate may include a silicon on insulator SOI wafer. According to an embodiment, the wafer substrate may include a semiconductor compound material, e.g. gallium arsenide (GaAs), indium phosphide (InP). According to an embodiment, the wafer substrate may include a quaternary semiconductor compound material, e.g. indium gallium arsenide (InGaAs).

Electronic circuit 104 may include a power semiconductor device. A power semiconductor device may be capable of carrying a voltage of up to approximately 600 V. Electronic circuit 104 may include but is not limited to a power semiconductor transistor. According to various embodiments, electronic circuit 104 may include at least one from the following group of semiconductor devices: the group consisting of: a power transistor, a power MOS transistor, a power bipolar transistor, a power field effect transistor, a power insulated gate bipolar transistor, a thyristor, a MOS controlled thyristors, a silicon controlled rectifier, a power schottky diode, a silicon carbide diode, a gallium nitride device.

One or more metal blocks 106, $106_1$, $106_2$ may be used for rewiring, e.g. as part of a redistribution structure described hereinafter. Carrier 334 may include an adhesive carrier foil.

One or more electronic circuits 104, $104_1$, $104_2$ may be placed with their chip top side, i.e. chip first side 116, over carrier 334, e.g. facing carrier 334. At least one of the one or more electronic circuits 104, $104_1$, $104_2$ may be arranged between a metal block 106 and a further metal block $106_1$. For example, electronic circuit $104_1$ may be arranged between metal block 106 and metal block $106_1$.

It may be understood that although according to various embodiments, metal block 106 is placed on carrier 334 before electronic circuit 104 is placed on carrier 334, electronic circuit 104 may be also be placed on carrier 334 before metal block 106 is placed on carrier 334.

The chip 104 may include a top side 116, which may also be referred to as a "first side", "front side" or "upper side" of the chip. As used herein, the terms "top side", "first side", "upper side" or "front side" of a chip may be understood to refer to a side of the chip wherein a gate region and at least one first source/drain region may be formed. The terms "top side", "first side", "upper side" and "front side" may be used interchangeably hereinafter. The chip may include a bottom side 124, which may also be referred to as "second side", "back side", or "bottom side" of the chip. As used herein with respect to semiconductor power devices, the terms "second side", "back side", or "bottom side" may be understood to refer to the side of the chip wherein a second source/drain region is formed. The terms "second side", "back side", or "bottom side" may be used interchangeably hereinafter.

Second side 124 may be opposite to first side 116. In other words, first side 116 may face direction 126 which is opposite to direction 128 which second side 124 faces.

Following 310 and 320, encapsulation material 108 may subsequently be deposited between one or more electronic circuits 104, $104_1$, $104_2$ and one or more metal blocks 106, $106_1$, $106_2$ (in 330). In other words, encapsulation material 108 may subsequently be deposited in spaces between at least one of one or more electronic circuits 104, 104₁, 104₂ and at least one of one or more metal blocks 106, 106₁, 106₂, e.g. between electronic circuit 104 and metal block 106.

Chip top side, i.e. chip first side 116, and chip back side, i.e. chip second side 124, may be sealed off by adhering temporary protective foils 336 to chip first side 116 and chip second side 124 (in 330). Temporary protective foils 336 may be formed over chip first side 116 and chip second side 124, as well as over metal block first side 356 and metal block second side 358, and attached by means of release tape. Temporary protective foils 336 which may be used as a cover structure, may form a masking material, which may guide the deposition of encapsulation material 108 in the regions between metal block 106 and electronic circuit 104. Temporary protective foil 336 may include a foil include one or more holes, wherein encapsulation material 108 may deposited from the side of the foils and/or through the holes. The holes may range from about 60 μm to about 120 μm, e.g. about 70 μm to about 110 μm, e.g. about 80 μm to about 100 μm. The holes may be larger than 60 μm, for example.

Encapsulation material 108 may hold electronic circuit 104 to neighboring metal block 106. The joining of electronic circuit 104 to neighboring metal block 106 may be further strengthened as encapsulation material 108 may be formed over one or more lateral sides 352, 354 of electronic circuit 104 and/or over one or more lateral sides of metal block 106 (not shown). One or more lateral sides 352, 354 of electronic circuit 104 may be arranged between first side 116 and second side 124 of electronic circuit 104. Similarly, one or more lateral sides of metal block 106 may be arranged between first side 356 and second side 358 of metal block 106, Each of the components, e.g. electronic circuit 104, 104₁, 104₂ and metal blocks 106, 106₁, 106₂ may be encapsulated by encapsulation material 108 which may include a molding material. Encapsulation material 108 may include at least one electrically insulating material from the group of electrically insulating materials, the group consisting of: an epoxy, a polymer, a laminate, a plastic, a thermoset, a thermoplastic, polyimide.

In 340, temporary protective foils 336 may be removed. Any adhesion or release tape may be removed. Encapsulated structure 338 may include metal block 106 and electronic circuit 104 arranged adjacent to each other, wherein encapsulation material 108 may be deposited between electronic circuit 104 and metal block 106. When a plurality of metal blocks 106 and electronic circuits 104 are being processed in parallel, encapsulated structure 338 may include one or more metal blocks 106, 106₁, 106₂ . . . 106ₙ and one or more electronic circuits 104, 104₁, 104₂ . . . 104ₙ, wherein at least one of one or more metal blocks 106, 106₁, 106₂ . . . 106ₙ may be arranged adjacent to at least one of one or more electronic circuits 104, 104₁, 104₂ . . . 104ₙ, wherein encapsulation material 108 may be deposited between at least one of one or more metal blocks 106, 106₁, 106₂ . . . 106ₙ and at least one of one or more electronic circuits 104, 104₁, 104₂ . . . 104ₙ.

In 350, first metal layer structure 112 may be electrically contacted to at least one first contact 114 on first side 116 of electronic circuit 104. In a parallel process, second metal layer structure 118 may be electrically contacted to at least one second contact 122 on second side 124 of electronic circuit 104. When a parallel process is carried out according to an embodiment, first metal layer structure 112 and second metal layer structure 118 may be mounted directly onto first side 116 and second side 124 of electronic circuit 104 respectively in a single process. First metal layer structure 112, which may be stacked by first side 116, and second metal layer structure 118, which may be stacked by second side 124, may be brought together so that encapsulated structure 338 may be sandwiched between first metal layer structure 112 on first side 116 and second metal layer structure 118 on second side 124 (in 360). In other words, encapsulated structure 338 may be pressed between first metal layer structure 112 and second metal layer structure 118 when first metal layer structure 112 and second metal layer structure 118 are brought together from both sides 116, 124. In other words, electronic circuit 104 may be sandwiched between first metal layer structure 112 and second metal layer structure 118 when first metal layer structure 112 and second metal layer structure 118 are brought together from both sides 116, 124. In other words, metal block 106 may be sandwiched between first metal layer structure 112 and second metal layer structure 118 when first metal layer structure 112 and second metal layer structure 118 are brought together from both sides 116, 124.

The assembly may be carried through the use of nanopaste, solder or diffusion solder. Top side 342 of first metal layer structure 112 may be a side of first metal layer structure 112 which faces electronic circuit first side 116. Top side 344 of second metal layer structure 118 first which may be a side of second metal layer structure 118 which faces electronic circuit second side 124. Top side 342 of first metal layer structure 112 and top side 344 of second metal layer structure 118 may be pre-coated with joining material 346. Alternatively, electronic circuit first 116 and second side 124 may be pre-coated with joining material 346. Joining material 346 may include at least one material from the following group of materials, the group consisting of: a nanopaste, a solder, a diffusion solder or an electrically conductive adhesive. Joining material 346 may be dispensed, printed or be directly coated to at least any of the surfaces for the interconnect, e.g. by sputtering or electrochemical deposition. First metal layer structure 112 may be electrically contacted to at least one first contact 114 on first side 116 of electronic circuit 104, and second metal layer structure 118 may be electrically contacted to at least one second contact 122 on second side 124 of electronic circuit 104, wherein first metal layer structure 112 and second metal layer structure 118 may be pressed together using a mold 348, and sintered in a temperature and pressure controlled process (in 360). The temperature may range from about 100 to about 400° C. The pressure may range from about 0.1 N/mm² to 50 N/mm². Choice of temperature or pressure may depend on the used material and interconnect technology. The temperature and pressure controlled process may take place in a vacuum.

During the parallel process, first metal layer structure 112 may be formed on, e.g. mounted directly onto, at least one first contact 114 on first side 116 of electronic circuit 104 and over first side 356 of metal block 106. Second metal layer structure 118 may be formed on e.g. mounted directly onto, at least one second contact 122 on second side 124 of electronic circuit 104 and over second side 358 of metal block 106.

At least one of the first metal layer structure 112 and second metal layer structure 118 may include a metal plate. At least one of the first metal layer structure 112 and second metal layer structure 118 may include a lead frame. At least one of the first metal layer structure 112 and second metal layer structure 118 may form a redistribution layer, which will be described hereinafter. At least one of the first metal layer structure 112 and second metal layer structure 118 may include at least one from the following group of materials, the group of materials consisting of: Cu, Au, Ag, Pd, Ni, Fe, Al and combinations thereof.

Metal block 106 may be electrically contacted to first metal layer structure 112 and to second metal layer structure 118 by means of an electrically conductive medium $132_1$, $132_2$.

Metal block first side 356 and metal block second side 358 may be pre-coated with electrically conductive medium $132_1$, $132_2$ before first metal layer structure 112 and to second metal layer structure 118 are electrically contacted to metal block 106. Alternatively, top side 342 of first metal layer structure 112 and top side 344 of second metal layer structure 118 may be pre-coated with electrically conductive medium $132_1$, $132_2$. Electrically conductive medium $132_1$, $132_2$ may be dispensed, printed or be directly coated to at least one of the surfaces for the interconnect, e.g. by sputtering, chemical deposition or electrochemical deposition.

Electrically conductive medium $132_1$, $132_2$ may include an electrically conductive contacting medium. Electrically conductive medium $132_1$, $132_2$ may include an adhesive configured to adhere metal block 160 to first 112 and second 118 metal layer structures. Electrically conductive medium $132_1$, $132_2$ may include a paste including nanoparticles. Electrically conductive medium $132_1$, $132_2$ may include at least one from the following group of materials, the group of materials consisting of: CuSn, AgSn, AuSn, Sn, Ag, In, Bi, Zn, Pb. Electrically conductive medium $132_1$, $132_2$ may include an electrically conductive adhesive, the electrically conductive adhesive including at least one from the following group of materials, the group of materials consisting of: CuSn, AgSn, AuSn, Sn, Ag, In, Bi, Zn, Pb.

Electrically conductive medium $13_{21}$, $13_{22}$ may include an intermetallic phase material. For example, electrically conductive medium $132_1$, $132_2$ may include at least one material from the following group of materials, the group consisting of: Ag—Sn, Cu—Sn, Cu—Sn—Ag, Au—Sn, Ni—Sn, Cu—Zn, Cu—Co, InSn, Pd—Sn, Au—Ag—Sn and Pd—Au—Sn.

According to an embodiment, electrically conductive medium $132_1$, $132_2$ may include a material different from the material of first 112 and second 118 metal layer structures or may have a material structure different from the material of first 112 and second 118 metal layer structures. For example, first 112 and second 118 metal layer structures may include a bulk metal material, e.g. Ag, whereas electrically conductive medium $132_1$, $132_2$ may include nanoparticles of the material, e.g. Ag nanoparticles. As another example, first 112 and second 118 metal layer structures may include a bulk metal material, e.g. Ag, whereas electrically conductive medium $132_1$, $132_2$ may include an intermetallic phase material, e.g. intermetallic phases system. Electrically conductive medium $132_1$, $132_2$ may include a composite material, the composite material including a mixture of at least one embedding material and at least one filler material. The at least one embedding material may include at least one from the following group of materials, the group consisting of: a paste, a polymer matrix, and wherein the at least one filler material may include one or more structures from the following group of structures, the group consisting of: particles, nanoparticles, microparticles, structures, nanostructures, microstructures, fibers, nanofibers, microfibers, wires, nanowires. The one or more structures may include at least one material from the following group of materials, the group consisting of: metals, metal oxides, silver, copper, graphene, carbon.

According to another embodiment, electrically conductive medium $132_1$, $132_2$ may include a material different from the material of metal block 106 or may have a material structure different from the material of metal block 106. According to another embodiment, electrically conductive medium $132_1$, $132_2$ may include first electrically conductive medium portion $132_1$ electrically contacted to first side 356 of metal block 106 and first metal layer structure 112; and second electrically conductive medium portion $132_2$ electrically contacted to second side 358 of metal block 106 and second metal layer structure 118. According to another embodiment, first electrically conductive medium portion $132_1$ may be made from a different material than second electrically conductive medium portion $132_2$.

According to an embodiment, electrically conductive medium $132_1$, $132_2$ and joining material 346 may be made from the same material.

According to an embodiment, electrically conductive medium $132_1$, $132_2$ and joining material 346 may be deposited in a single parallel process.

It may be understood that although a single parallel process has been described herein, first metal layer structure 112 and second metal layer structure 118 may be, according to another embodiment, respectively contacted to first side 116 and second side 124, in separate, i.e. serial processes. It may be understood that first metal layer structure 112 may be electrically contacted to at least one first contact 114 on first side 116 of electronic circuit 104, and subsequently second metal layer structure 118 may be electrically contacted to at least one second contact 122 on second side 124 of electronic circuit 104. It may be understood that second metal layer structure 118 may be electrically contacted to at least one second contact 122 on second side 124 of electronic circuit 104, and subsequently first metal layer structure 112 may be electrically contacted to at least one first contact 114 on first side 116 of electronic circuit 104.

It may also be understood, that although various embodiments herein and hereinafter have been described with respect to semiconductor power devices, various embodiments may also apply to low power semiconductor devices. In this respect, it may be understood that various embodiments may be adapted for low power semiconductor devices, e.g. devices capable of carrying up to 100 V to 150 V. For example, "top side", "first side", "upper side" or "front side" of a chip may be understood to refer to the side of the chip which carries one or more contact pads, or electrical contacts, wherein bonding pads or electrical connects may be attached; or wherein it is the side of the chip which may be mostly covered by metallization layers. "Second side", "back side", or "bottom side" may be understood to refer to the side of the chip which may be free from metallization or contact pads or electrical contacts.

It may also be understood that although various embodiments describe a first metal layer structure 112 for electrically contacting to front side 116 and second metal layer structure 118 for electrically contacting to back side 124, it may be possible that electrically contacting second metal layer structure 118 to back side 124 may not be required. In which case, second metal layer structure 118 may be omitted.

In 370, mold 348 may be removed. Structuring of first metal layer structure 112 and second metal layer structure 118 may be carried out. For example, photolithographic processes, followed by selective etching, may be used to selectively pattern and subsequently remove portions of first metal layer structure 112 and second metal layer structure 118. In 370, structuring of first metal layer structure 112 and second metal layer structure 118 may result in chip connection contacts being separated, e.g. electrically isolated.

According to an embodiment, electronic circuit 104 may include a power transistor, wherein at least one first contact 114 may include a first source/drain contact pad $114_{S/D}$ and a gate contact pad $114_G$ electrically isolated from the first source/drain contact pad $114_{S/D}$; and the at least one second contact 122 may include a second source/drain contact pad $122_{S/D}$, wherein the first source/drain contact pad $114_{S/D}$, second source/drain contact pad $122_{S/D}$ and gate contact pad $114_G$, are electrically connected to electronic circuit 104. Gate contact pad $114_G$ may be electrically isolated from the first source/drain contact pad $114_{S/D}$ by means of an electrically insulating material deposited over electronic circuit first side 116, between gate contact pad $114_G$ and first source/drain contact pad $114_{S/D}$. The electrically insulating material may include the same or a different material as encapsulation material 108.

First metal layer structure 112 may include a first metal layer structure first portion $112_{S/D}$ electrically contacted to first source/drain contact pad $114_{S/D}$ on first side 116 of electronic circuit 104; first metal layer structure second portion $112_G$ electrically contacted to gate contact pad $114_G$ on first side 116 of electronic circuit 104; and first metal layer structure third portion $112_M$ electrically contacted to the metal block 106, wherein at least one of first metal layer structure first portion $112_{S/D}$, second portion $112_G$ and third portion $112_M$, is electrically isolated from each other. For example, first portion $112_{S/D}$ may be electrically isolated from second portion $112_G$ and third portion $112_M$; second portion $112_G$ may be electrically isolated from first portion $112_{S/D}$ and third portion $112_M$; third portion $112_M$ may be electrically isolated from first portion $112_{S/D}$ and second portion $112_G$.

First metal layer structure 112, second metal layer structure 118 and metal block 106 may form a redistribution structure. For example, third portion $112_M$ may provide an electrical connection on metal block first side 356 to second source/drain contact pad $122_{S/D}$ formed on electronic circuit second side 124. The electrical connection between electronic circuit second side 124 and metal block first side 356 may be provided via second source/drain contact pad $122_{S/D}$ which may be electrical contacted to metal block 106 on metal block second side 358 via second metal layer structure 118. Metal block 106 may be further electrically contacted to first metal layer structure third portion $112_M$ on metal block first side 356. Metal block 106 may be electrically contacted to first metal layer structure 112, e.g. third portion $112_M$ and to second metal layer structure 118, e.g. $118_M$, by means of electrically conductive medium $132_1$, $132_2$. In this way, metal block 106 may form a basis for the redistribution structure.

In 380, separation of components my occur, wherein the components may be individualized into individual circuit packages through an individualization process using a laser or mechanical saw. The separation may be carried out such that each individualized component may include a circuit package, e.g. circuit package 302. Each separated circuit package 302 may be subsequently directly mounted onto a printed circuit board. Circuit package 302 will be further described hereinafter.

Electronic circuit 104, e.g. a semiconductor chip, may have a thickness $t_{chip}$ ranging from about 5 μm to about 500 μm, e.g. from about 10 μm to about 350 μm, e.g. from about 50 μm to about 250 μm.

Metal block 106 may have a thickness $t_M$ ranging from about 5 μm to about 500 μm, e.g. from about 10 μm to about 350 μm, e.g. from about 50 μm to about 250 μm.

First metal layer structure 112 and second metal layer structure 118 may each have a thickness t ranging from about 10 μm to about 1000 μm, e.g. from about 20 μm to about 500 μm, e.g. from about 20 μm to about 250 μm.

Electrically conductive medium $132_1$, $132_2$ may have a thickness ranging from about 0.5 μm to about 100 μm, e.g. from about 1 μm to about 75 μm, e.g. from about 1 μm to about 50 μm.

Joining material 346 may have a thickness ranging from 0.5 μm to about 100 μm, e.g. from about 1 μm to about 75 μm, e.g. from about 1 μm to about 50 μm.

FIGS. 4A to 4D show method 400 for encapsulating one or more electronic circuits 104, $104_1$, $104_2$ . . . $104_n$ according to another embodiment. Method 400 may include one or more or all of the processes already described with respect to method 300, except that structuring of first metal layer structure 112 may take place before process 350.

According to an embodiment, method 400 may include generally, processes 310, 320, 330 and 340. However, before process 350, first metal layer structure 112 may be pre-structured to form first portion $112_{S/D}$, second portion $112_G$ and third portion $112_M$, before first metal layer structure 112 is electrically contacted to at least one first contact 114 on first side 116 of electronic circuit 104. Therefore, according to method 400, structuring by photolithography and selective etching of first metal layer structure 112 may be omitted in process 370.

Second metal layer structure 118 may also optionally be pre-structured prior to process 350. In other words, second metal layer structure portion $118_{S/D}$ may be formed prior to process 350 wherein structuring of second metal layer structure 118 as described in process 370 may be omitted.

First metal layer structure 112 may therefore include individualized portions, i.e. a patterned lead frame. namely, first portion $112_{S/D}$, second portion $112_G$ and third portion $112_M$ even prior to process 350, and therefore, need not be structured, e.g. using photolithography or selective etching, as described in process 350.

The individualized portions of first metal layer structure 112 and second metal layer structure 118, which may optionally include individualized portion of second metal layer structure $118_{S/D}$, may be brought together to sandwich encapsulated structure 338 as described in process 350. This is shown in 410.

Process 420 may be carried out as described according to process 360. First metal layer structure first portion $112_{S/D}$ may be electrically contacted to first source/drain contact pad $114_{S/D}$ on first side 116 of electronic circuit 104. First metal layer structure second portion $112_G$ may be electrically contacted to gate contact pad $114_G$ on first side 116 of electronic circuit 104. First metal layer structure third portion $112_M$ may be electrically contacted to the metal block 106, wherein first portion $112_S/D$, second portion $112_G$ and third portion $112_M$ and second metal layer structure 118 may be pressed together using mold 348, in a temperature and pressure controlled process, such that encapsulated structure 338 may be sandwiched by first portion $112_{S/D}$, second portion $112_G$ and third portion $112_M$ on first side 116 and second metal layer structure 118 (optionally $118_{S/D}$) on second side 124. First portion $112_{S/D}$, second portion $112_G$ and third portion $112_M$, may be electrically isolated from each other. If pre-structuring of second metal layer structure 118 was not carried out prior to step 350, then if necessary, second metal layer structure 118 may be structured after the press molding process through the application of photolithography, and selectively etching to form $118_{S/D}$ as described in 370. Second metal layer structure portion $118_{S/D}$ may be electrically isolated from a neighbouring second metal layer structure portion $118_{S/D1}$ which may be connected to a neighboring electronic circuit $104_1$.

Process 430 and 440 may be carried out as described according to process 380. Separation of components my occur, wherein the components may be individualized from other circuit packages through an individualization process using a laser or mechanical saw, wherein the laser or sawing processing separates a circuit package 302 through encapsulation material 108. The separation may be carried out such that each individualized component may include a circuit package, e.g. circuit package 302 (in 430). Each separated circuit package 302 as shown in 440 may be subsequently directly mounted onto a printed circuit board or constructed in a circuit board assembly. Circuit package 302 will be further described hereinafter.

FIG. 5 shows method 500 for encapsulating an electronic circuit according to an embodiment. Method 500 may include:

placing an electronic circuit and a metal block on a carrier (in 510);

placing a cover structure above the metal block and the electronic circuit, on a side opposite to the carrier (in 520);

inserting encapsulation material through the cover structure between the metallic structure and the electronic circuit (in 530);

removing the cover structure and the carrier (in 540); and fixing a metal layer structure on at least one side of the electronic circuit such that the metal layer structure electrically contacts the electronic circuit and the metal block (in 550).

Cover structure as described in method 500 may include temporary protective foils 336.

It may be understood that one or more processes already described with respect to any one of methods 200, 300, or 400 may be combined with one or more processes of method 500.

It may be understood that process 510 may include one or more or all of the processes already described with respect to processes 310 and 320. It may be understood that processes 520, 530 and 540 may include one or more or all of the processes already described with respect to processes 330 and 340. It may be understood that process 540 may include one or more or all of the processes already described with respect to processes 350 and 360. According to another embodiment, process 540 may include one or more or all of the processes already described with respect to processes 410 and 420.

Figure 6:
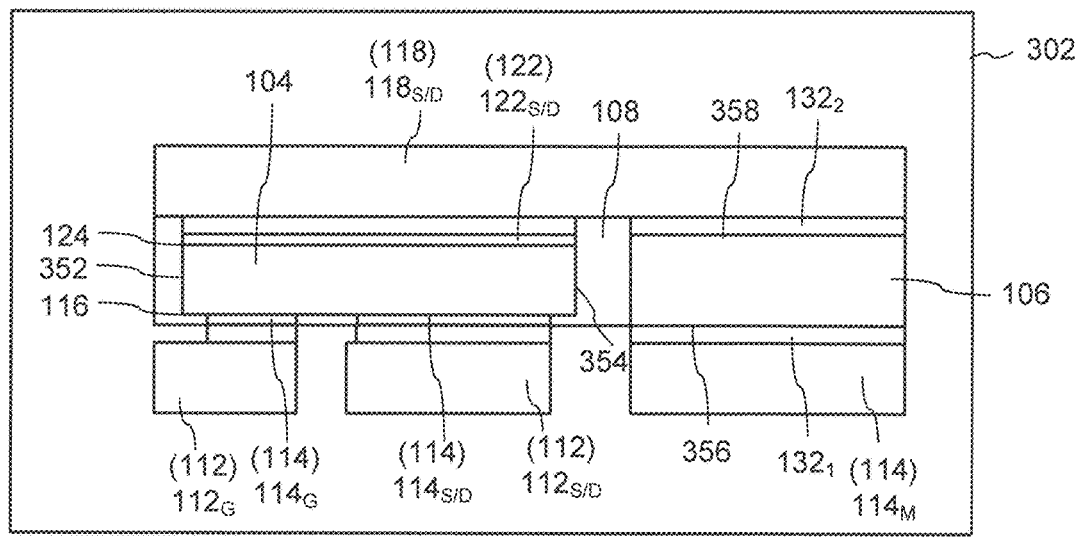
FIG. 6 shows a circuit package according to an embodiment.

FIG. 6 shows circuit package 302 according to an embodiment. Circuit package 302 may include an individualized circuit package, formed in accordance with any one of methods 200, 300, 400 or 500 already described herein. Circuit package 302 may include all the basic functionalities of the features described with respect to circuit package 102.

Circuit package 302 may include electronic circuit 104, e.g. a semiconductor chip, and metal block 106 next to electronic circuit 104. Circuit package 302 may include encapsulation material 108 between electronic circuit 104 and metal block 106. Circuit package 302 may include first metal layer structure 112 electrically contacted to at least one first contact 114 on first side 116 of electronic circuit 104. Circuit package 302 may include second metal layer structure 118 electrically contacted to at least one second contact 122 on second side 124 of electronic circuit 104. Second side 124 may be opposite to first side 116. In other words, first side 116 may face direction 126 which is opposite to direction 128 which second side 124 faces. Metal block 106 may be electrically contacted to first metal layer structure 112 and to second metal layer structure 118 by means of an electrically conductive medium $132_1$, $132_2$. Electrically conductive medium $132_1$, $132_2$ may include a material different from the material of first 112 and second 118 metal layer structures or may have a material structure different from the material of first 112 and second 118 metal layer structures.

Electrically conductive medium $132_1$, $132_2$ may include a material different from the material of metal block 106 or may have a material structure different from the material of metal block 106.

Electrically conductive medium $132_1$, $132_2$ may include first electrically conductive medium portion $132_1$ electrically contacted to first side 356 of metal block 106 and first metal layer structure 112; and second electrically conductive medium portion $132_2$ electrically contacted to second side 358 of metal block 106 and second metal layer structure 118.

First electrically conductive medium portion $132_1$ may be made from a different material than second electrically conductive medium portion $132_2$.

Electrically conductive medium $132_1$, $132_2$ may include an adhesive configured to adhere metal block 160 to first 112 and second 118 metal layer structures.

Electrically conductive medium $132_1$, $132_2$ may include a paste including nanoparticles.

Electrically conductive medium $132_1$, $132_2$ may include at least one from the following group of materials, the group of materials consisting of: CuSn, CuSnAg, AgSn, AuSn, Sn, Ag, In, Bi, Zn, Pb.

Electrically conductive medium $132_1$, $132_2$ may include a composite material, the composite material including a mixture of at least one embedding material and at least one filler material. The at least one embedding material may include at least one from the following group of materials, the group consisting of: a paste, a polymer matrix, and wherein the at least one filler material may include one or more structures from the following group of structures, the group consisting of: particles, nanoparticles, microparticles, structures, nanostructures, microstructures, fibers, nanofibers, microfibers, wires, nanowires. The one or more structures may include at least one material from the following group of materials, the group consisting of: metals, metal oxides, silver, copper, graphene, carbon.

Electrically conductive medium $132_1$, $132_2$ may include an electrically conductive adhesive, the electrically conductive adhesive including at least one from the following group of materials, the group of materials consisting of: CuSn, CuSnAg, AgSn, AuSn, Sn, Ag, In, Bi, Zn, Pb.

First metal layer structure 112 may be formed on at least one first contact 114 on first side 116 of electronic circuit 104 and over first side 356 of metal block 106.

Second metal layer structure 118 may be formed on at least one second contact 122 on second side 124 of electronic circuit 104 and over second side 358 of metal block 106.

At least one of the first metal layer structure 112 and second metal layer structure 118 may include a lead frame.

At least one of the first metal layer structure 112 and second metal layer structure 118 may form a redistribution layer.

At least one of the first metal layer structure 112 and second metal layer structure 118 may include at least one from the following group of materials, the group of materials consisting of: Cu, Au, Ag, Pd, Ni, Fe, Al and combinations thereof.

Metal block 106 may include at least one from the following group of materials, the group of materials consisting of: Cu, Au, Ag, Pd, Ni, Fe, Al and combinations thereof.

Electronic circuit 104 may include a power semiconductor transistor.

At least one first contact 114 may include a first source/drain contact pad $114_{S/D}$ and a gate contact pad $114_G$ electrically isolated from the first source/drain contact pad $114_{S/D}$; and the at least one second contact 122 may include a second source/drain contact pad $122_{S/D}$.

First metal layer structure 112 may include a first metal layer structure first portion $112_{S/D}$ electrically contacted to first source/drain contact pad $114_{S/D}$ on first side 116 of electronic circuit 104; first metal layer structure second portion $112_G$ electrically contacted to gate contact pad $114_G$ on first side 116 of electronic circuit 104; and first metal layer structure third portion $112_M$ electrically contacted to the metal block 106, wherein at least one of first metal layer structure first portion $112_{S/D}$, second portion $112_G$ and third portion $112_M$, is electrically isolated from each other.

Encapsulation material 108 may include at least one electrically insulating material from the group of electrically insulating materials, the group consisting of: an epoxy, a polymer, a laminate, a plastic, a thermoplastic, polyimide.

Encapsulation material 108 may be formed on one or more lateral sides 352, 354 of electronic circuit 104 wherein one or more lateral sides 352, 354 of electronic circuit 104 may be arranged between first side 116 and second side 124 of electronic circuit 104.

Figure 7:
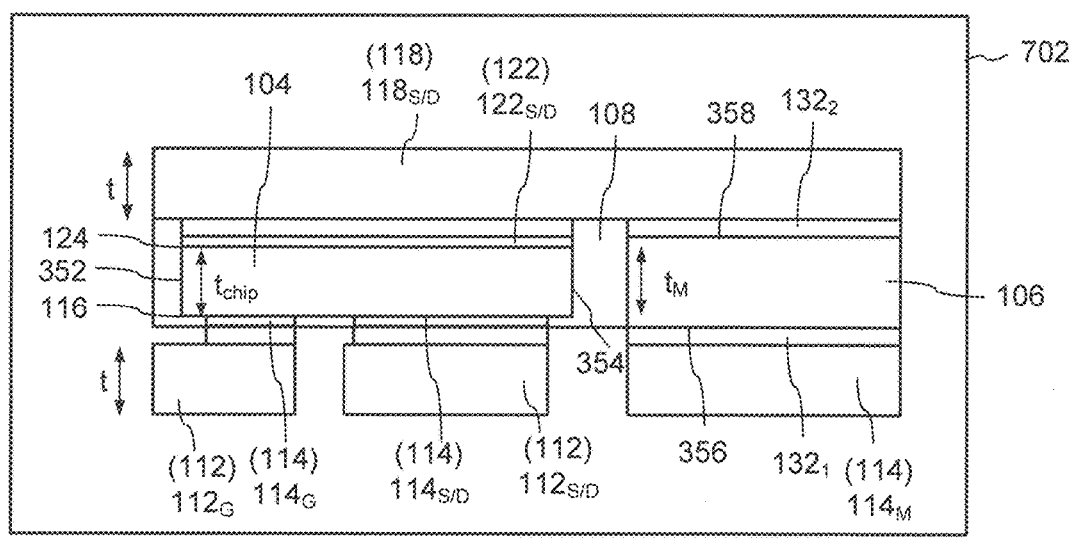
FIG. 7 shows an electronic circuit package according to an embodiment.

FIG. 7 shows circuit package 702 according to an embodiment.

Electronic circuit package 702 may include encapsulation material 108 configured to hold metal block 106 next to semiconductor chip 104. Encapsulation material 108 may be formed between semiconductor chip 104 and metal block 106. Electronic circuit package 702 may include first metal layer structure 112 configured to electrically contact at least one first contact 114 on first side 116 of semiconductor chip 104. Electronic circuit package 702 may include second metal layer structure 118 configured to electrically contact at least one second contact 122 on second side 124 of semiconductor chip 104, wherein second side 124 is opposite to the first side 116. Metal block 106 may be electrically contacted to first metal layer structure 112 and to second metal layer structure 118 by means of electrically conductive medium $132_1$, $132_2$; wherein electrically conductive medium $132_1$, $132_2$ may include a material different from the material of the first 112 and second 118 metal layer structures or may have a material structure different from the material of the first 112 and second 118 metal layer structures. Electronic circuit package 702 may include one or more or all the basic functionalities of one or more or all of the features already described herein with respect to electronic circuit package 302.

FIG. 8 shows method 800 for encapsulating an electronic circuit, e.g. electronic circuit 104, according to an embodiment. Method 800 may include:

forming encapsulation material for holding a metal block next to a semiconductor chip between the semiconductor chip and the metal block (in 810);

electrically contacting a first metal layer structure to at least one first contact on a first side of the semiconductor chip (in 820);

electrically contacting a second metal layer structure to at least one second contact on a second side of the semiconductor chip, wherein the second side is opposite to the first side (in 830); and electrically contacting the metal block to the first metal layer structure and to the second metal layer structure by means of an electrically conductive medium including a material different from the material of the first and second metal layer structures or a material structure different from the material of the first and second metal layer structures (in 840).

It may be understood that one or more processes already described with respect to any one of methods 200, 300, 400, 500 may be combined with one or more processes of method 800. It may be understood that process 810 may include one or more or all of the processes already described with respect to processes 310, 320 and 330. It may be understood that processes 820, 830 and 840 may include one or more or all of the processes already described with respect to processes 350 and 360.

Figure 10:
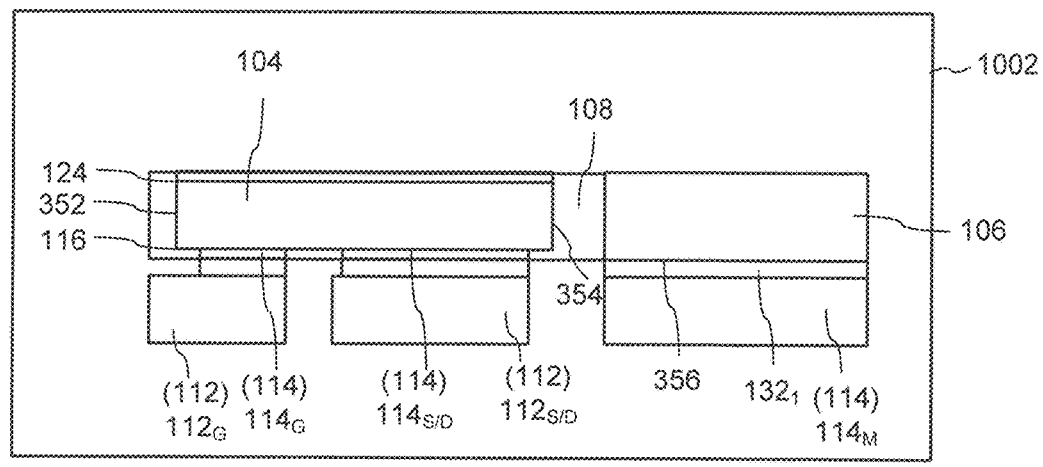
FIG. 10 shows a circuit package according to an embodiment.

FIG. 10 shows circuit package 1002 according to an embodiment. Circuit package 1002 may include an individualized circuit package, formed in accordance with any one of methods 200, 300, 400 or 500 already described herein.

Circuit package 1002 may include electronic circuit 104 and metal block 106 next to electronic circuit 104. Electronic circuit 104 may be referred to hereinafter as a chip, a semiconductor chip, a semiconductor, a die. Circuit package 102 may include encapsulation material 108 between electronic circuit 104 and metal block 106. Circuit package 102 may include metal layer structure 112 electrically contacted to at least one first contact 114 on first side 116 of electronic circuit 104. Metal block 106 may be electrically contacted to metal layer structure 112 by means of an electrically conductive medium $132_1$. Electrically conductive medium $132_1$ may include a material different from the material of metal layer structure 112 or may have a material structure different from the material of metal layer structure 112. It may be understood that circuit package 902 may include one or more or all of the properties of packages 102, 302, 702, except that circuit package 902 may not include second metal layer structure 118 electrically connected to electronic circuit 104. Furthermore, metal block 106 may therefore not be electrically connected to second metal layer structure 118. It may further be understood that according another embodiment, circuit package 1002 may include second metal layer structure 118 and not first metal layer structure 112. One or more or all of the features already described above with respect to at least one of first metal layer structure 112 and second metal layer structure 118 apply to circuit package 1002.

Various embodiments provide a single parallel process, wherein front side and back side contacts of a plurality of encapsulated components, e.g. electronic circuits, e.g. semiconductor chips, may be realised in a single process. As the contacts on both sides may be exposed and face outwardly from the chip package, optimal cooling of the electronic components may be achieved. Therefore, electrical and thermal resistances may be improved.

Various embodiments furthermore provide a simple realisation for multichip housings. It may be understood that each chip package may include one or more electronic circuits. Flexibility in the arrangement of the chip may be further possible. For example, a first electronic circuit may be arranged to face down, e.g. to face direction 126, and a second electronic circuit may be arranged to face up, e.g. to face direction 128. Therefore, a front side of a first electronic circuit and a back side of a second electronic circuit may electrically contact first metal layer structure 112.

Various embodiments may provide that the manufacturing processes according to any one of methods 200, 300, 400, 500 or 800 may be carried such that the number of temperature loads carried out may be reduced. For example, only one temperature load may be necessary, wherein all electronic circuit contacts 114, 122 may created in a single temperature load process.

Various embodiments therefore provide a manufacturing process for forming a circuit package which may include fewer processes through the use of parallel processes. Due to reduced stress from manufacturing processes, e.g. pressure and heating, and as a result of optimal package cooling, the reliability of components may be increased.

Various embodiments provide a circuit package, including: an electronic circuit; a metal block next to the electronic circuit; encapsulation material between the electronic circuit and the metal block; a first metal layer structure electrically contacted to at least one first contact on a first side of the electronic circuit; a second metal layer structure electrically contacted to at least one second contact on a second side of the electronic circuit, wherein the second side is opposite to the first side; wherein the metal block is electrically contacted to the first metal layer structure and to the second metal layer structure by means of an electrically conductive medium; wherein the electrically conductive medium includes a material different from the material of the first and second metal layer structures or has a material structure different from the material of the first and second metal layer structures.

According to an embodiment, the electrically conductive medium includes a material different from the material of the metal block or has a material structure different from the material of the metal block.

According to an embodiment, the electrically conductive medium includes a first electrically conductive medium portion electrically contacted to a first side of the metal block and the first metal layer structure; and a second electrically conductive medium portion electrically contacted to a second side of the metal block and the second metal layer structure.

According to an embodiment, the first electrically conductive medium portion is made from a different material than the second electrically conductive medium portion.

According to an embodiment, the electrically conductive medium includes an adhesive configured to adhere the metal block to the first and second metal layer structures.

According to an embodiment, the electrically conductive medium includes a paste including nanoparticles.

According to an embodiment, the electrically conductive medium may include a composite material, the composite material including a mixture of at least one embedding material and at least one filler material.

According to an embodiment, the at least one embedding material may include at least one from the following group of materials, the group consisting of: a paste, a polymer matrix, and wherein the at least one filler material may include one or more structures from the following group of structures, the group consisting of particles, nanoparticles, microparticles, structures, nanostructures, microstructures, fibers, nanofibers, microfibers, wires, nanowires.

According to an embodiment, the one or more structures may include at least one material from the following group of materials, the group consisting of: metals, metal oxides, silver, copper, graphene, carbon.

According to an embodiment, the electrically conductive medium includes at least one from the following group of materials, the group of materials consisting of: CuSn, CuSnAg, AgSn, AuSn, Sn, Ag, In, Bi, Zn, Pb.

According to an embodiment, the electrically conductive medium may include an electrically conductive adhesive, the electrically conductive adhesive including at least one from the following group of materials, the group of materials consisting of: CuSn, CuSnAg, AgSn, AuSn, Sn, Ag, In, Bi, Zn, Pb.

According to an embodiment, the first metal layer structure is formed on the at least one first contact on the first side of the electronic circuit and over a first side of the metal block.

According to an embodiment, the second metal layer structure is formed on the at least one second contact on the second side of the electronic circuit and over a second side of the metal block.

According to an embodiment, at least one of the first metal layer structure and the second metal layer structure includes a lead frame.

According to an embodiment, at least one of the first metal layer structure and the second metal layer structure forms a redistribution layer.

According to an embodiment, at least one of the first metal layer structure and the second metal layer structure includes at least one from the following group of materials, the group of materials consisting of: Cu, Au, Ag, Pd, Ni, Fe, Al and combinations thereof.

According to an embodiment, the metal block includes at least one from the following group of materials, the group of materials consisting of: Cu, Au, Ag, Pd, Ni, Fe, Al and combinations thereof.

According to an embodiment, the electronic circuit includes a power semiconductor transistor.

According to an embodiment, the at least one first contact includes a first source/drain contact pad and a gate contact pad electrically isolated from the first source/drain contact pad; and the at least one second contact includes a second source/drain contact pad.

According to an embodiment, the first metal layer structure includes a first metal layer structure first portion electrically contacted to the first source/drain contact pad on the first side of the electronic circuit; a first metal layer structure second portion electrically contacted to the gate contact pad on the first side of the electronic circuit; and a first metal layer structure third portion electrically contacted to the metal block, wherein at least one of the first metal layer structure first portion, second portion and third portion, is electrically isolated from each other.

According to an embodiment, the encapsulation material includes at least one electrically insulating material from the group of electrically insulating materials, the group consisting of: an epoxy, a polymer, a laminate, a plastic, a thermoset, a thermoplastic, polyimide.

According to an embodiment, the encapsulation material is formed on one or more lateral sides of the electronic circuit wherein the one or more lateral sides of the electronic circuit are arranged between the first side and the second side of the electronic circuit.

Various embodiments provide a method for encapsulating an electronic circuit, the method including: arranging a metal block and an electronic circuit adjacent to each other on a carrier; subsequently depositing encapsulation material between the electronic circuit and the metal block; electrically contacting a first metal layer structure to at least one first contact on a first side of the electronic circuit; electrically contacting a second metal layer structure to at least one second contact on a second side of the electronic circuit, wherein the second side is opposite to the first side.

According to an embodiment, the method further includes electrically contacting the metal block to the first metal layer structure and to the second metal layer structure by means of an electrically conductive medium including a material different from the material of the first and second metal layer structures or a material structure different from the material of the first and second metal layer structures.

Various embodiments provide a method for encapsulating an electronic circuit, the method including: placing an electronic circuit and a metal block on a carrier; placing a cover structure above the metal block and the electronic circuit, on a side opposite to the carrier; inserting encapsulation material through the cover structure between the metallic structure and the electronic circuit; removing the cover structure and the carrier; and fixing a metal layer structure on at least one side of the electronic circuit such that the metal layer structure electrically contacts the electronic circuit and the metal block.

Various embodiments provide an electronic circuit package, including: encapsulation material configured to hold a metal block next to a semiconductor chip, wherein the encapsulation material is formed between the semiconductor chip and the metal block; a first metal layer structure configured to electrically contact at least one first contact on a first side of the semiconductor chip; a second metal layer structure configured to electrically contact at least one second contact on a second side of the semiconductor chip, wherein the second side is opposite to the first side; and wherein the metal block is electrically contacted to the first metal layer structure and to the second metal layer structure by means of an electrically conductive medium; wherein the electrically conductive medium includes a material different from the material of the first and second metal layer structures or has a material structure different from the material of the first and second metal layer structures.

Various embodiments provide a method for encapsulating an electronic circuit, the method including: forming encapsulation material for holding a metal block next to a semiconductor chip between the semiconductor chip and the metal block; electrically contacting a first metal layer structure to at least one first contact on a first side of the semiconductor chip; electrically contacting a second metal layer structure to at least one second contact on a second side of the semiconductor chip, wherein the second side is opposite to the first side; and electrically contacting the metal block to the first metal layer structure and to the second metal layer structure by means of an electrically conductive medium including a material different from the material of the first and second metal layer structures or a material structure different from the material of the first and second metal layer structures.

Various embodiments provide a circuit package, the circuit package including: an electronic circuit; a metal block next to the electronic circuit; encapsulation material between the electronic circuit and the metal block; a metal layer structure electrically contacted to at least one first contact on a first side of the electronic circuit; wherein the metal block is electrically contacted to the metal layer structure by means of an electrically conductive medium; wherein the electrically conductive medium may include a material different from the material of the metal layer structure or has a material structure different from the material of the metal layer structure.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A circuit package, comprising:
an electronic circuit;
one or more metal blocks next to the electronic circuit;
an encapsulation material between the electronic circuit and the metal block;
a first metal layer structure electrically contacted to at least one first contact pad on a first side of the electronic circuit;
a second metal layer structure electrically contacted to at least one second contact pad on a second side of the electronic circuit, wherein the second side is opposite to the first side;
a joining material between the at least one first contact pad on a first side of the electronic circuit and the first metal layer structure; and
an electrically conductive medium comprising a first electrically conductive medium electrically contacting the metal block to the first metal layer structure and a second electrically conductive medium electrically contacting the metal block to the second metal layer structure;
wherein the first metal layer structure and the second metal layer structure comprise a metallic element;
wherein the first electrically conductive medium comprises a first intermetallic phase material comprising a first metallic element that is a different element than the metallic element and the second electrically conductive medium comprises a second intermetallic phase material comprising a second metallic element that is a different element than the metallic element;
wherein the first metallic element is a different element than the second metallic element; and
wherein the electrically conductive medium and the joining material is a paste comprising one or more of nanoparticles, nanostructures, nanofibers, nanowires, graphene, and combinations thereof;
wherein the electrically conductive medium comprises at least one from the following group of materials, the group of materials consisting of: Ag—Sn, Cu—Sn, Cu—Sn—Ag, Au—Sn, Ni—Sn, Cu—Zn, Cu—Co, In—Sn, Pd—Sn, Au—Ag—Sn, Pd—Au—Sn, and combinations thereof; and
wherein the first electrically conductive medium is configured to change between a solid and a liquid at a first temperature, and wherein the second electrically conductive medium is configured to change between a solid and a liquid at a second temperature, different from the first temperature.

2. The circuit package of claim 1,
wherein the electrically conductive medium has a material structure different from the material of the metal block.

3. The circuit package of claim 1,
wherein
the first electrically conductive medium electrically contacts a first side of the metal block and the first metal layer structure; and the second electrically conductive medium electrically contacts a second side of the metal block and the second metal layer structure.

4. The circuit package of claim 1, wherein the one or more of nanoparticles, nanostructures, nanofibers, nanowires, graphene, and combinations thereof comprises at least one material from the following group of materials, the group consisting of: metals, metal oxides, silver, copper, carbon, and combinations thereof.

5. The circuit package of claim 1, wherein the first metal layer structure is formed on the at least one first contact pad on the first side of the electronic circuit and over a first side of the metal block.

6. The circuit package of claim 1, wherein the second metal layer structure is formed on the at least one second contact pad on the second side of the electronic circuit and over a second side of the metal block.

7. The circuit package of claim 1, wherein the first metal layer structure and the second metal layer structure comprise a lead frame.

8. The circuit package of claim 1, wherein the first metal layer structure and the second metal layer structure form a redistribution layer.

9. The circuit package of claim 1, wherein the first metal layer structure and the second metal layer structure comprise at least one from the following group of materials, the group of materials consisting of: Cu, Au, Ag, Pd, Ni, Fe, Al, and combinations thereof.

10. The circuit package of claim 1, wherein the metal block comprises at least one from the following group of materials, the group of materials consisting of: Cu, Au, Ag, Pd, Ni, Fe, Al, and combinations thereof.

11. The circuit package of claim 1, wherein the electronic circuit comprises a power semiconductor transistor.

12. The circuit package of claim 1, wherein the at least one first contact pad comprises a first source/drain contact pad and a gate contact pad electrically isolated from the first source/drain contact pad; and
wherein the at least one second contact pad comprises a second source/drain contact pad.

13. The circuit package of claim 1, wherein the first metal layer structure comprises
a first metal layer structure first portion electrically contacted to the first source/drain contact pad on the first side of the electronic circuit;
a first metal layer structure second portion electrically contacted to the gate contact pad on the first side of the electronic circuit; and
a first metal layer structure third portion electrically contacted to the metal block, wherein at least one of the first metal layer structure first portion, second portion and third portion, is electrically isolated from each other.

14. The circuit package of claim 1, wherein the encapsulation material comprises at least one electrically insulating material from the group of electrically insulating materials, the group consisting of: an epoxy, a polymer, a laminate, a plastic, a thermoset, a thermoplastic, polyimide, and combinations thereof.

15. The circuit package of claim 1, wherein the encapsulation material is formed on one or more lateral sides of the electronic circuit wherein the one or more lateral sides of the electronic circuit are arranged between the first side and the second side of the electronic circuit.

16. The circuit package of claim 1, wherein the one or more metal blocks are externally exposed on one or more sides of the circuit package.

17. The circuit package of claim 1, wherein a difference between the first temperature and the second temperature is determined at least by a melting temperature of first metallic element and a melting temperature of the second metallic element.

18. An electronic circuit package, comprising:
an encapsulation material configured to hold one or more metal blocks next to a semiconductor chip, wherein the encapsulation material is formed between the semiconductor chip and the metal block;
a first metal layer structure configured to electrically contact at least one first contact pad on a first side of the semiconductor chip;
a second metal layer structure configured to electrically contact at least one second contact pad on a second side of the semiconductor chip, wherein the second side is opposite to the first side;
a joining material between the at least one first contact pad and the first metal layer structure; and
an electrically conductive medium comprising a first electrically conductive medium electrically contacting the metal block to the first metal layer structure and a second electrically conductive medium electrically contacting the metal block to the second metal layer structure;
wherein the first metal layer structure and the second metal layer structure comprise a metallic element;
wherein the first electrically conductive medium comprises a first intermetallic phase material comprising a first metallic element that is a different element than the metallic element and the second conductive medium comprises a second intermetallic phase materials comprising a second metallic element that is a different element than the metallic element; and
wherein the first metallic element is a different element than the second metallic element
wherein the electrically conductive medium comprises at least one from the following group of materials, the group of materials consisting of: Ag—Sn, Cu—Sn, Cu—Sn—Ag, Au—Sn, Ni—Sn, Cu—Zn, Cu—Co, In—Sn, Pd—Sn, Au—Ag—Sn, Pd—Au—Sn, and combinations thereof; and
wherein the first electrically conductive medium is configured to change between a solid and a liquid at a first temperature, and wherein the second electrically conductive medium is configured to change between a solid and a liquid at a second temperature, different from the first temperature.

19. An electronic circuit package, comprising:
an encapsulation material configured to hold a one or more metal blocks next to a semiconductor chip, wherein the encapsulation material is formed between the semiconductor chip and the metal block;
a first metal layer structure configured to electrically contact at least one first contact pad on a first side of the semiconductor chip;

a second metal layer structure configured to electrically contact at least one second contact pad on a second side of the semiconductor chip, wherein the second side is opposite to the first side;

a joining material between the at least one first contact pad and the first metal layer structure;

wherein the metal block is electrically contacted to the first metal layer structure and to the second metal layer structure by means of an electrically conductive medium;

wherein the first metal layer structure and the second metal layer structure comprise a metallic element; and wherein the electrically conductive medium comprises an intermetallic phase material comprising the metallic element;

wherein the electrically conductive medium comprises at least one from the following group of materials, the group of materials consisting of: Ag—Sn, Cu—Sn, Cu—Sn—Ag, Au—Sn, Ni—Sn, Cu—Zn, Cu—Co, In—Sn, Pd—Sn, Au—Ag—Sn, Pd—Au—Sn, and combinations thereof; and wherein the first electrically conductive medium is configured to change between a solid and a liquid at a first temperature, and wherein the second electrically conductive medium is configured to change between a solid and a liquid at a second temperature, different from the first temperature.

20. The circuit package of claim 19, wherein the electrically conductive medium and the joining material are formed of the same material.

* * * * *